(12) United States Patent
Kondo et al.

(10) Patent No.: US 7,706,450 B2
(45) Date of Patent: Apr. 27, 2010

(54) BLOCK DISTORTION DETECTION METHOD, BLOCK DISTORTION DETECTION APPARATUS, BLOCK DISTORTION REMOVAL METHOD, AND BLOCK DISTORTION REMOVAL APPARATUS

(75) Inventors: Satoshi Kondo, Kyoto (JP); Tetsuya Itani, Nara (JP)

(73) Assignee: Panasonic Corporation, Osaka (JP)

( * ) Notice: Subject to any disclaimer, the term of this patent is extended or adjusted under 35 U.S.C. 154(b) by 1463 days.

(21) Appl. No.: 11/061,465

(22) Filed: Feb. 22, 2005

(65) Prior Publication Data

US 2005/0141619 A1 Jun. 30, 2005

Related U.S. Application Data

(62) Division of application No. 09/982,788, filed on Oct. 22, 2001, now Pat. No. 7,031,393.

(30) Foreign Application Priority Data

Oct. 20, 2000 (JP) ............................. 2000-320595

(51) Int. Cl.
*H04N 7/12* (2006.01)
*H04N 11/02* (2006.01)
*H04N 11/04* (2006.01)
*H04B 1/66* (2006.01)

(52) U.S. Cl. ................................................. 375/240.29
(58) Field of Classification Search ....................... None
See application file for complete search history.

(56) References Cited

U.S. PATENT DOCUMENTS

| 5,767,986 | A | * | 6/1998 | Kondo et al. | ............ | 358/426.14 |
| 6,041,145 | A | * | 3/2000 | Hayashi et al. | ............. | 382/268 |
| 6,104,434 | A | * | 8/2000 | Nakagawa et al. | ...... | 375/240.16 |
| 6,504,873 | B1 | * | 1/2003 | Vehvilainen | ........... | 375/240.29 |

FOREIGN PATENT DOCUMENTS

| JP | 04318784 | 11/1992 |
| JP | 2643636 | 9/1997 |
| JP | 11-275584 | 10/1999 |

* cited by examiner

*Primary Examiner*—Nhon T Diep
(74) *Attorney, Agent, or Firm*—Wenderoth, Lind & Ponack, L.L.P.

(57) ABSTRACT

A video decoder is connected with a block distortion detector for specifying the boundary of blocks where block boundary occurs, using decoded image data and information of motion vectors, which are supplied from the video decoder; and a block distortion remover for subjecting pixels in the vicinity of the block boundary of the decoded image to filtering on the basis of the result of detection from the block distortion detector, thereby removing the block distortion. Therefore, block distortion is accurately detected when a compressed and coded image is decoded, and the detected block distortion is removed while minimizing the blurriness of the image.

13 Claims, 11 Drawing Sheets

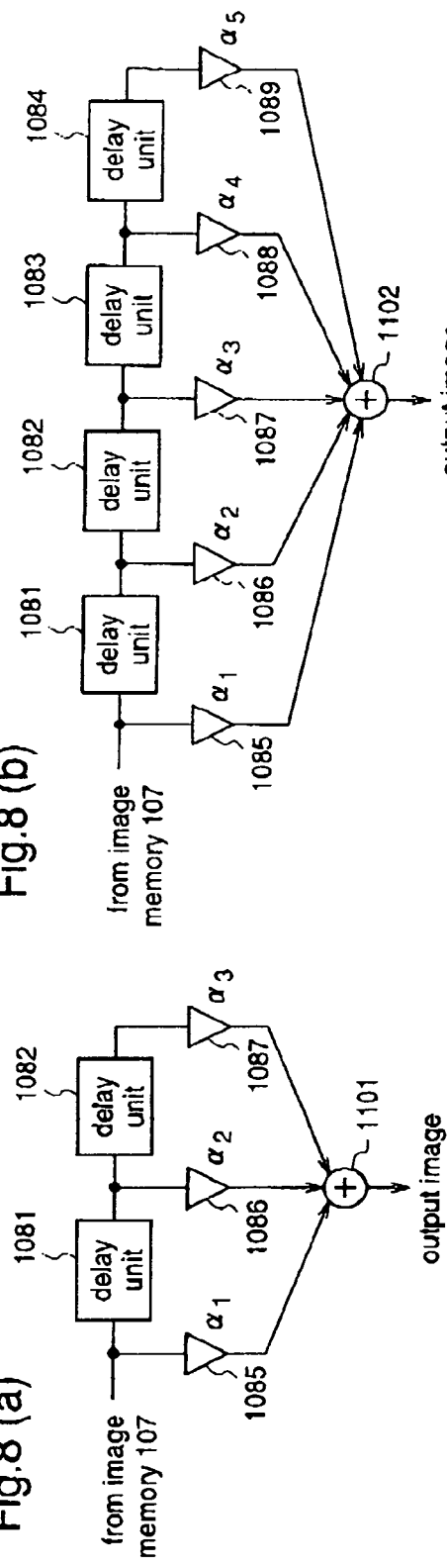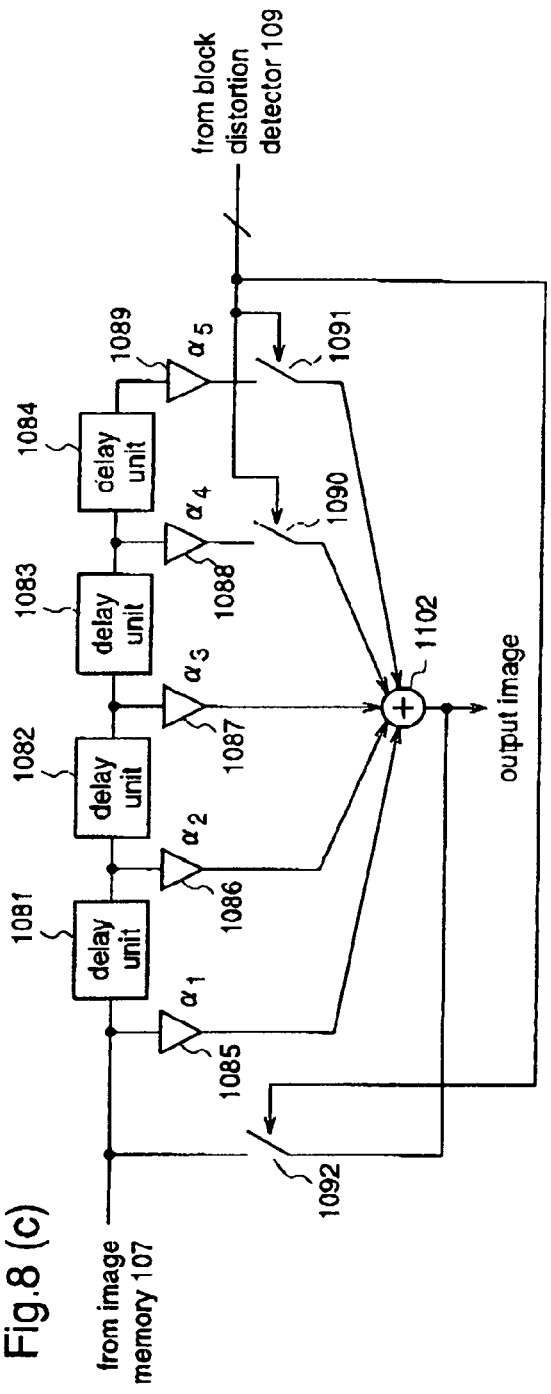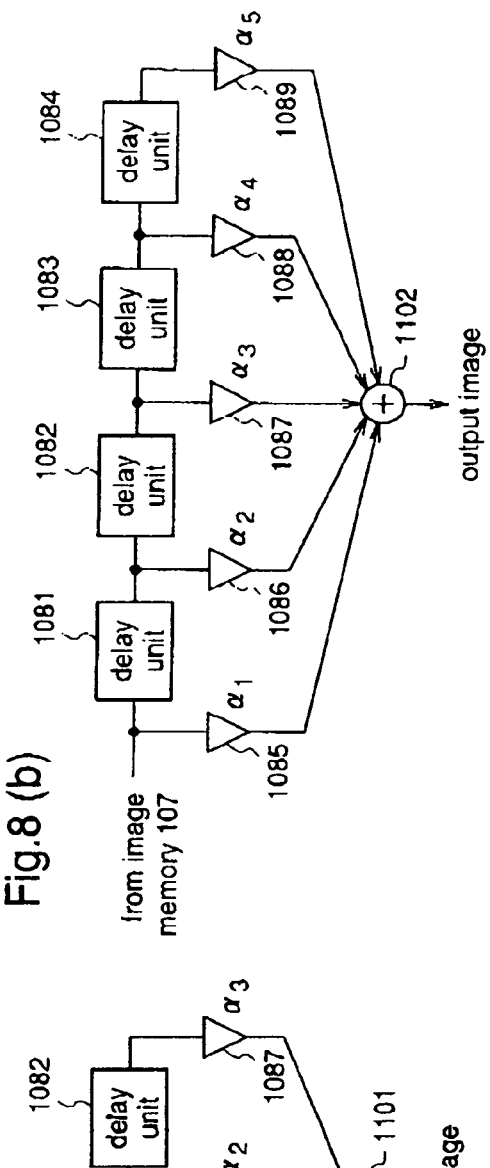

BLOCK DISTORTION DETECTION METHOD, BLOCK DISTORTION DETECTION APPARATUS, BLOCK DISTORTION REMOVAL METHOD, AND BLOCK DISTORTION REMOVAL APPARATUS

This is a divisional application of U.S. patent application Ser. No. 09/982,788, filed Oct. 22, 2001 now U.S. Pat. No. 7,031,393.

FIELD OF THE INVENTION

The present invention relates to a method and an apparatus for detecting block distortion which occurs when an image that is subjected to compressive coding in block units is decoded. Further, the invention relates to a method and an apparatus for removing the block distortion.

BACKGROUND OF THE INVENTION

In recent years, MPEG (Moving Picture Expert Group), H.263, and the like have been widely used as high-performance compression coding schemes for images in the fields of broadcasting, communication, and storage. In the MPEG or H.263 scheme, coding is carried out by removing redundancies in the spatial direction and in the temporal direction from an image. Hereinafter, the outline of the MPEG scheme will be described.

First of all, in order to remove a redundancy in the spatial direction, which is included in image information, discrete cosine transform (hereinafter referred to as DCT) and quantization are used. To be specific, an input image is divided into units called blocks each comprising 8×8 pixels and, thereafter, DCT is performed on each block to convert it into coefficients (DCT coefficients) in the frequency domain. Then, quantization is performed on the DCT coefficients. The quantization is a process of dividing the DCT coefficients by using both of a quantization matrix having values corresponding to the respective frequencies in the DCT domain, and a quantization step. By the quantization, the frequency components having relatively small DCT coefficients become "0". Since, in a general image signal, the energy concentrates on the low frequency domain, high-frequency components are removed by this process. However, since visual characteristics of human beings have lower ability of discrimination for higher frequencies, degradation in image quality due to quantization is less conspicuous as the quantization step used for quantization is smaller.

On the other hand, in order to remove a redundancy in the temporal direction, motion compensation is employed. In motion compensation, an area nearest to a reference image is selected using a macroblock comprising 16×16 pixels as a unit of motion compensation. Then, a difference in values between the selected area and the reference image is coded. Since this difference value is approximately "0" when the motion is not very fast, the temporal redundancy can be removed.

Generally, when the bit rate is high, i.e., when the compression ratio is small, degradation in image quality is hardly conspicuous in the MPEG scheme. However, when the bit rate becomes lower, i.e., when the compression ratio is increased, degradation in image quality, i.e., coding noise, begins to be conspicuous. There is block distortion as typical coding noise in the MPEG scheme.

Block distortion is a phenomenon in which the boundaries of each block sharply look like a tile. This is caused by that an image signal in a block has only low frequency components, and the values of the low frequency components differ from those of adjacent blocks.

Block distortion is different from conventional analog noise in that it is considerably conspicuous as degradation in image quality. There have been proposed several methods for removing block distortion. For example, Japanese Published Patent Application No. Hei. 11-275584 discloses a method for removing block distortion. This literature discloses a method of converting a motion vector of a target macroblock into a motion vector per frame, and changing the characteristics of a filter to be applied to an image after decoding, according to the size of the converted motion vector.

In the conventional method described above, a frequency response of a low-pass filter, i.e., a cutoff frequency, is determined according to the size of the motion vector. Then, the decoded image is subjected to filtering using the determined filter to remove block distortion. At this time, the frequency response of the filter should be determined so that the cutoff frequency is lowered as the motion vector becomes larger. However, even when the motion vector is large, degradation in image quality occurs when an area having high-frequency components is subjected to filtering.

Further, in the conventional method, the volume of processing per block for detecting block distortion is constant independently of the resolution of the image signal. That is, whether the resolution of the image signal is high or low, the volume of processing is the same. Therefore, as the resolution of the image signal becomes higher, the total volume of processing increases.

SUMMARY OF THE INVENTION

The present invention is made to solve the above-described problems and has for its object to provide a block distortion detection method, a block distortion detection apparatus, a block distortion removal method, and a block distortion removal apparatus, which do not cause degradation in image quality due to false detection when removing block distortion.

Further, it is another object of the present invention to provide a block distortion detection method, a block distortion detection apparatus, a block distortion removal method, and a block distortion removal apparatus, which can prevent the volume of processing from increasing in proportion to the number of pixels, and which can suppress an increase in the volume of processing even when an image signal has high resolution.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, there is provided a block distortion removal method comprising: receiving a decoded image signal obtained by decoding code sequences which are obtained by dividing an image signal into plural blocks each comprising plural pixels and then coding the image signal, and obtaining a first difference in pixel values between two pixels across the boundary of adjacent blocks, and a second difference in pixel values between two pixels which belong to a block in the vicinity of the block boundary; and correcting the pixel values of pixels in the vicinity of the block boundary, according to the values of the first and second differences. Therefore, block distortion can be reduced, and degradation in image quality can be suppressed.

According to a second aspect of the present invention, there is provided a block distortion detection method comprising: receiving a decoded image signal obtained by decoding code sequences which are obtained by dividing an image signal into plural blocks each comprising plural pixels and then coding the image signal, and obtaining a first difference in pixel values between two pixels across the boundary of adjacent blocks, and a second difference in pixel values between two pixels which belong to a block in the vicinity of the block boundary; and deciding that a block distortion occurs at the block boundary when the absolute value of the first difference is larger than a first threshold value and the absolute value of the second difference is smaller than a second threshold value, and deciding that a stronger block distortion occurs at the block boundary as the first and second threshold values are smaller. Therefore, not only the presence or absence of block distortion but also the strength thereof can be detected, and appropriate correction of block distortion can be carried out using the result of detection.

According to a third aspect of the present invention, there is provided a block distortion detection method comprising: receiving a decoded image signal obtained by decoding code sequences which are obtained by dividing an image signal into plural blocks each comprising plural pixels and then coding the image signal using motion compensation for a unit including at least one block, and obtaining a first difference in pixel values between two pixels across the boundary of blocks/motion-compensation-units which is the boundary between adjacent blocks as well as the boundary between adjacent motion compensation units, and a second difference in pixel values between two pixels which belong to a block in the vicinity of the boundary of blocks/motion-compensation-units; and deciding that a block distortion occurs at the boundary when the absolute value of the first difference is larger than a first threshold value while the absolute value of the second difference is smaller than a second threshold value, and the amount of motion in motion compensation units across the boundary of blocks/motion-compensation-units is larger than a third threshold value, and deciding that a strong block distortion occurs at the boundary when the first and second threshold values are small, and the amount of motion in motion compensation units across the boundary of blocks/motion-compensation-units is large. Therefore, the presence or absence of block distortion and the strength thereof can be finally detected according to the result of detection of block distortion based on the pixel values as well as the result of detection of block distortion based on the motion vector, whereby block distortion, which cannot be detected by the conventional method using only the pixel values or the motion vector, can be detected. Conversely, false detection of block distortion according to only the pixel values or the motion vector can be avoided. Further, when removing block distortion using the result of detection, noise removal according to the strength of the block distortion can be carried out, whereby the block distortion can be reliably removed without performing false detection while minimizing the blurriness of the image.

According to a fourth aspect of the present invention, in the block distortion detection method according to the third aspect, the amount of motion is the maximum value among the amounts of motion in the motion compensation units which are adjacent to each other. Therefore, the presence or absence of block distortion and the strength thereof can be finally detected according to the result of detection of block distortion based on the pixel values as well as the result of detection of block distortion based on the motion vector, whereby block distortion, which cannot be detected by the conventional method using only the pixel values or the motion vector, can be detected. Conversely, false detection of block distortion according to only the pixel values or the motion vector can be avoided. Further, when removing block distortion using the result of detection, noise removal according to the strength of the block distortion can be carried out, whereby the block distortion can be reliably removed without performing false detection while minimizing the blurriness of image.

According to a fifth aspect of the present invention, there is provided a block distortion detection method comprising: receiving a decoded image signal obtained by decoding code sequences which are obtained by dividing an image signal into plural blocks each comprising plural pixels and then coding the image signal, and obtaining a first difference in pixel values between two pixels across the boundary of adjacent blocks, and a second difference in pixel values between two pixels which belong to a block in the vicinity of the block boundary; and performing detection of block distortion at the block boundary using the values of the first and second differences, by a detection method in which the volume of processing decreases as the resolution of the decoded image signal becomes larger. Therefore, when detection of block distortion is carried out using only the pixel values, the volume of processing for the detection can be changed according to the resolution of the target image, whereby detection of block distortion can be carried out without increasing the volume of processing in spite of an increase in the image size.

According to a sixth aspect of the present invention, there is provided a block distortion detection method comprising: receiving a decoded image signal obtained by decoding code sequences which are obtained by dividing an image signal into plural blocks each comprising plural pixels and then coding the image signal using motion compensation for a unit including at least one block, and obtaining a first difference in pixel values between two pixels across the boundary of blocks/motion-compensation-units which is the boundary of adjacent blocks as well as the boundary of adjacent motion compensation units, and a second difference in pixel values between two pixels which belong to a block in the vicinity of the boundary of blocks/motion-compensation-units; and performing detection of block distortion at the boundary of blocks/motion-compensation-units, using the values of the first and second differences and the amount of motion in motion compensation units across the boundary of blocks/motion-compensation-units, by a detection method in which the volume of processing decreases as the resolution of the decoded image signal becomes larger. Therefore, the presence or absence of block distortion and the strength thereof can be finally detected according to the result of detection of block distortion based on the pixel values as well as the result of detection of block distortion based on the motion vector, whereby block distortion, which cannot be detected by the conventional apparatus using only the pixel values or the motion vector, can be detected. Conversely, false detection of block distortion according to only the pixel values or the motion vector can be avoided. Further, when removing block distortion using the result of detection, noise removal according to the strength of the block distortion can be carried out, whereby the block distortion can be reliably removed without performing false detection while minimizing the blurriness of image. Furthermore, detection of block distortion can be carried out with less volume of processing as the resolution of the input image is higher. The lower the resolution is, the smaller the volume of decoding processing becomes, and the larger the volume of processing for removing block distortion removal becomes. On the other hand, the higher the resolution is, the larger the volume of decoding processing becomes, and the smaller the volume of processing for removing block distortion becomes. As the result, the total volume of processing for decoding and distortion removal can be reduced.

According to a seventh aspect of the present invention, in the block distortion detection method according to the fifth or sixth aspect, the reduction of the volume of processing is carried out by reducing the number of pixels to be used for detection of block distortion. Therefore, when performing detection of block distortion, the volume of processing for the detection can be changed by changing the number of pixels used for the detection according to the resolution of the target image, whereby detection of block distortion can be carried out without increasing the volume of processing in spite of an increase in the image size.

According to an eighth aspect of the present invention, in the block distortion detection method according to the fifth or sixth aspect, the reduction of the volume of processing is carried out by reducing the number of strength levels of block distortion to be detected. Therefore, when performing detection of block distortion, the volume of processing for the detection can be changed by changing the levels of strength of block distortion to be detected according to the resolution of the target image, whereby detection of block distortion can be carried out without increasing the volume of processing in spite of an increase in the image size.

According to a ninth aspect of the present invention, in the block distortion detection method according to the sixth aspect, the reduction of the volume of processing is carried out by executing no detection of block distortion employing the amount of motion when the resolution is high. Therefore, when performing detection of block distortion, the volume of processing for the detection can be changed according to the resolution of the target image, whereby detection of block distortion can be carried out without increasing the volume of processing in spite of an increase in the image size.

According to a tenth aspect of the present invention, there is provided a block distortion removal method for removing the block distortion which is detected by the block distortion detection method according to any of the second, third, fifth, and sixth aspects, wherein the pixel values of pixels in the vicinity of the block boundary are corrected according to the result of the detection of block distortion. Therefore, the accuracy of detection of block distortion is improved in relation to the conventional method, whereby more appropriate removal of block distortion is achieved.

According to an eleventh aspect of the present invention, in the block distortion removal method according to the tenth aspect, the correction of pixel values is carried out using a filter having different characteristics according to the strength levels of block distortion. Therefore, the accuracy of detection of block distortion is improved in relation to the conventional method, whereby more appropriate removal of block distortion is achieved.

According to a twelfth aspect of the present invention, in the block distortion removal method according to the tenth aspect, after the pixels in the vicinity of the boundary are subjected to a predetermined filtering, the correction of pixel values is carried out by using pixel values which are obtained by performing weighted-averaging on the pixels of the decoded image and the filtered pixels, according to the strength of the block distortion. Therefore, removal of block distortion according to the strength of block distortion can be carried out using a single filter, without the necessity for changing the combination of filters according to the strength of detected block distortion. Thereby, the scale of hardware or the like can be reduced. Further, since the weights of the input image and the filtered image are changed according to the strength of block distortion although only a single filter is employed, noise removal according to the strength of block distortion can be carried out, whereby block distortion can be removed reliably without performing false detection while minimizing the blurriness of image.

According to a thirteenth aspect of the present invention, there is provided a block distortion detection apparatus comprising: an image decoder for receiving code sequences which are obtained by dividing an image signal into plural blocks each comprising plural pixels and then coding the image signal using motion compensation for a unit including at least one block, decoding the code sequences to generate a decoded image signal, and extracting a motion vector which is used for the motion compensation at the decoding; and a pixel value inspector for receiving the decoded image signal, obtaining a first difference in pixel values between two pixels across the boundary of adjacent blocks, and a second difference in pixel values between two pixels which belong to a block in the vicinity of the block boundary, deciding that block distortion occurs at the block boundary when the absolute value of the first difference is larger than a first threshold value and the absolute value of the second difference is smaller than a second threshold value, and deciding that a stronger block distortion occurs as the first and second threshold values are smaller. Therefore, not only the presence or absence of block distortion but also the strength thereof can be detected, and appropriate correction of block distortion can be carried out using the result of detection.

According to a fourteenth aspect of the present invention, there is provided a block distortion detection apparatus comprising: an image detector for receiving code sequences which are obtained by dividing an image signal into plural blocks each comprising plural pixels and then coding the image signal using motion compensation for a unit including at least one block, decoding the code sequences to generate a decoded image signal, and extracting a motion vector which is used for the motion compensation at the decoding; a pixel value inspector for receiving the decoded image signal, obtaining a first difference in pixel values between two pixels across the boundary of blocks/motion-compensation-units which is the boundary between adjacent blocks as well as the boundary between adjacent motion compensation units, and a second difference in pixel values between two pixels which belong to a block in the vicinity of the boundary of blocks/motion-compensation-units, and deciding that block distortion occurs at the boundary of blocks/motion-compensation-units when the absolute value of the first difference is larger than a first threshold value and the absolute value of the second difference is smaller than a second threshold value; a motion vector inspector for receiving the motion vector, and deciding that block distortion occurs when the amount of motion in motion compensation units across the boundary of blocks/motion-compensation-units is larger than a third threshold value; and a block distortion decision unit for finally deciding whether block distortion occurs or not, on the basis of the results of detection of block distortion by the pixel value inspector and the motion vector inspector. Therefore, the presence or absence of block distortion and the strength thereof can be finally detected according to the result of detection of block distortion based on the pixel values as well as the result of detection of block distortion based on the motion vector, whereby block distortion, which cannot be detected by the conventional apparatus using only the pixel values or the motion vector, can be detected. Conversely, false detection of block distortion according to only the pixel values or the motion vector can be avoided. Further, when removing block distortion using the result of detection, noise removal according to the strength of the block distortion can be carried out, whereby the block distortion can be reliably removed without performing false detection while minimizing the blurriness of image.

According to a fifteenth aspect of the present invention, in the block distortion detection apparatus according to the fourteenth aspect, the pixel value inspector decides that a stronger block distortion occurs as the first and second threshold values are smaller; and the motion vector inspector decides that a stronger block distortion occurs as the amount of motion is larger. Therefore, the presence or absence of block distortion and the strength thereof can be finally detected according to the result of detection of block distortion based on the pixel values as well as the result of detection of block distortion based on the motion vector, whereby block distortion, which cannot be detected by the conventional apparatus using only the pixel values or the motion vector, can be detected. Conversely, false detection of block distortion according to only the pixel values or the motion vector can be avoided. Further, when removing block distortion using the result of detection, noise removal according to the strength of the block distortion can be carried out, whereby the block distortion can be reliably removed without performing false detection while minimizing the blurriness of image.

According to a sixteenth aspect of the present invention, in the block distortion detection apparatus according to the fifteenth aspect, the amount of motion is the maximum value among the respective amounts of motion in the motion compensation units which are adjacent to each other. Therefore, the presence or absence of block distortion and the strength thereof can be finally detected according to the result of detection of block distortion based on the pixel values as well as the result of detection of block distortion based on the motion vector, whereby block distortion, which cannot be detected by the conventional apparatus using only the pixel values or the motion vector, can be detected. Conversely, false detection of block distortion according to only the pixel values or the motion vector can be avoided. Further, when removing block distortion using the result of detection, noise removal according to the strength of the block distortion can be carried out, whereby the block distortion can be reliably removed without performing false detection while minimizing the blurriness of image.

According to a seventeenth aspect of the present invention, there is provided a block distortion detection apparatus comprising: an image decoder for receiving code sequences which are obtained by dividing an image signal into plural blocks each comprising plural pixels and then coding the image signal using motion compensation for a unit including at least one block, decoding the code sequences to generate a decoded image signal, and extracting a motion vector which is used for the motion compensation at the decoding, and the resolution of the decoded image signal; a resolution decision unit for deciding, among a plurality of predetermined ranges, a range where the resolution of the decoded image signal belongs; a pixel value inspector for receiving the decoded image signal, obtaining a first difference in pixel values between two pixels across the boundary of adjacent blocks, and a second difference in pixel values between two pixels which belong to a block in the vicinity of the block boundary, and deciding that block distortion occurs at the block boundary when the absolute value of the first difference is larger than a first threshold value and the absolute value of the second difference is smaller than a second threshold value; a motion vector inspector for receiving the motion vector, and deciding that strong block distortion occurs at the block boundary when the amount of motion in motion compensation units across the block boundary is larger than a third threshold value; and a block distortion decision unit for finally deciding whether block distortion occurs or not, on the basis of the results of detection of block distortion by the pixel value inspector and the motion vector inspector; wherein, as the resolution of the decoded image signal, which is decided by the resolution decision unit, increases, the volume of processing by at least one of the pixel value inspector and the motion vector inspector decreases. Therefore, when performing detection of block distortion using the pixel values and the amount of motion compensation, the volume of processing for the detection can be changed according to the resolution of the target image, whereby detection of block distortion can be carried out without increasing the volume of processing in spite of an increase in the image size.

According to an eighteenth aspect of the present invention, there is provided a block distortion detection apparatus comprising: an image detector for receiving code sequences which are obtained by dividing an image signal into plural blocks each comprising plural pixels and then coding the image signal using motion compensation for a unit including at least one block, decoding the code sequences to generate a decoded image signal, and extracting a motion vector which is used for the motion compensation at the decoding, and the resolution of the decoded image signal; a resolution decision unit for deciding, among a plurality of predetermined ranges, a range where the resolution of the decoded image signal belongs; a pixel value inspector for receiving the decoded image signal, obtaining a first difference in pixel values between two pixels across the boundary of blocks/motion-compensation-units which is the boundary between adjacent blocks as well as the boundary between adjacent motion compensation units, and a second difference in pixel values between two pixels which belong to a block in the vicinity of the boundary of blocks/motion-compensation-units, and deciding that block distortion occurs at the boundary of blocks/motion-compensation-units, when the absolute value of the first difference is larger than a first threshold value and the absolute value of the second difference is smaller than a second threshold value; a motion vector inspector for receiving the motion vector, and deciding that block distortion occurs at the boundary, when the amount of motion in motion compensation units across the boundary of blocks/motion-compensation-units is larger than a third threshold value; and a block distortion decision unit for finally deciding whether block distortion occurs or not, and the strength of the block distortion, on the basis of the results of detection of block distortion by the pixel value inspector and the motion vector inspector; wherein, as the resolution of the decoded image signal, which is decided by the resolution decision unit, increases, the volume of processing by at least one of the pixel value inspector and the motion vector inspector decreases. Therefore, the presence or absence of block distortion and the strength thereof can be finally detected according to the result of detection of block distortion based on the pixel values as well as the result of detection of block distortion based on the motion vector, whereby block distortion, which cannot be detected by the conventional apparatus using only the pixel values or the motion vector, can be detected. Conversely, false detection of block distortion according to only the pixel values or the motion vector can be avoided.

According to a nineteenth aspect of the present invention, in the block distortion detection apparatus according to the seventeenth or eighteenth aspect, the reduction of the volume of processing is carried out by reducing the number of pixels to be used for detection of block distortion. Therefore, when performing detection of block distortion, the volume of processing for the detection can be changed by changing the number of pixels to be used for detection of block distortion according to the resolution of the target image, whereby detection of block distortion can be carried out without increasing the volume of processing in spite of an increase in the image size.

According to a twentieth aspect of the present invention, in the block distortion detection apparatus according to the seventeenth or eighteenth aspect, the reduction of the volume of processing is carried out by reducing the number of strength levels of block distortion to be detected. Therefore, when performing detection of block distortion, the volume of processing for the detection can be changed by changing the levels of strength of block distortion to be detected according to the resolution of the target image, whereby detection of block distortion can be carried out without increasing the volume of processing in spite of an increase in the image size.

According to a twenty-first aspect of the present invention, in the block distortion detection apparatus according to the seventeenth or eighteenth aspect, the reduction of the volume of processing is carried out by executing no detection of block distortion using the motion vector when the resolution is high. Therefore, when performing detection of block distortion, the volume of processing for the detection can be changed according to the resolution of the target image, whereby detection of block distortion can be carried out without increasing the volume of processing in spite of an increase in the image size.

According to a twenty-second aspect of the present invention, there is provided a block distortion removal apparatus for removing block distortion detected by the block distortion detection apparatus according to any of the thirteenth, fourteenth, seventeenth, and eighteenth aspects, comprising: a block distortion remover for receiving the decoded image signal and the result of block distortion detection, and correcting the pixel values of pixels of the decoded image signal in the vicinity of the boundary, according to the result of block distortion detection. Therefore, the accuracy of detection of block distortion is improved in relation to the conventional method, thereby more appropriate removal of block distortion is achieved.

According to a twenty-third aspect of the present invention, in the block distortion removal apparatus according to the twenty-second aspect, the correction of pixel values is carried out using a filter having different characteristics according to the strength levels of the block distortion. Therefore, the accuracy of detection of block distortion is improved in relation to the conventional method, thereby more appropriate removal of block distortion is achieved.

According to a twenty-fourth aspect of the present invention, in the block distortion removal apparatus according to the twenty-second aspect, after the pixels in the vicinity of the boundary are subjected to a predetermined filtering, the correction of pixel values is carried out using pixel values which are obtained by performing weighted-averaging on the pixels of the decoded image and the filtered pixels, according to the strength of the block distortion. Therefore, removal of block distortion according to the strength of block distortion can be carried out using a single filter, without the necessity for changing the combination of filters according to the strength of detected block distortion. Thereby, the scale of hardware or the like can be reduced. Further, since the weights of the input image and the filtered image are changed according to the strength of block distortion although only a single filter is used, noise removal according to the strength of block distortion can be carried out, whereby block distortion can be removed reliably without performing false detection while minimizing the blurriness of image.

BRIEF DESCRIPTION OF THE DRAWINGS

FIGS. 8(a)-8(c) are diagrams illustrating the constructions of a 3-tap low-pass filter and a 5-tap low-pass filter, as a constituent of the block distortion remover according to the first embodiment.

DETAILED DESCRIPTION OF THE PREFERRED EMBODIMENTS

Hereinafter, the preferred embodiments of the present invention will be described with reference to the drawings. In the embodiments of the invention, it is premised that a compressed video code sequence is generated by MPEG-2.

Embodiment 1

A first embodiment of the present invention corresponds to Claims 1~4, 1~16, 22, and 23.

Figure 1:
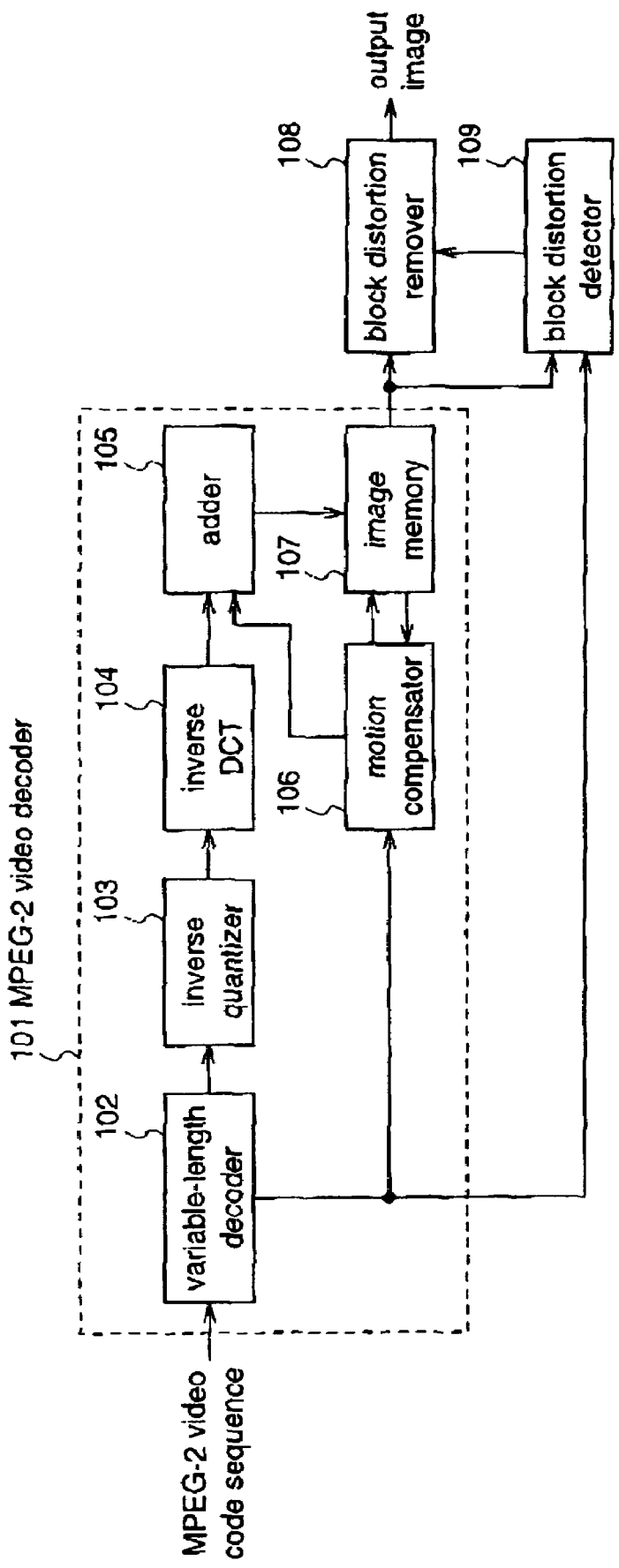
FIG. 1 is a block diagram for explaining a first embodiment of the present invention.

FIG. 1 is a block diagram illustrating an MPEG-2 decoder having a block distortion detection apparatus and a block distortion removal apparatus which employ a block distortion detection method and a block distortion removal method according to a first embodiment of the invention, respectively. In FIG. 1, 102 denotes a variable-length decoder for decoding an MPEG-2 video code sequence which is a variable-length code; 103 denotes an inverse quantizer for subjecting the decoded variable-length code to inverse quantization; 104 denotes an inverse DCT unit for subjecting the output of the inverse quantizer 103 to inverse DCT; 106 denotes a motion compensator for subjecting the output of the variable-length decoder 102 to motion compensation; 105 denotes an adder for adding the output of the inverse DCT unit 104 and the output of the motion compensator 106; 107 denotes an image memory for temporarily holding decoded image data; and 101 denotes an MPEG-2 video decoder comprising the above-mentioned variable-length decoder 102, inverse quantizer 103, inverse DCT unit 104, adder 105, motion compensator 106, and image memory 107.

Further, 109 denotes a block distortion detector for detecting whether block distortion occurs or not, using the outputs of the image memory 107 and the variable-length decoder 102 in the MPEG-2 video decoder, and 108 denotes a block distortion remover for removing block distortion, using the output of the block distortion detector 109. The block distortion detector 109 corresponds to the block distortion detection apparatus for detecting block distortion on the basis of the block distortion detection method according to the present invention, and the block distortion remover 108 corresponds to the block distortion removal apparatus for removing block distortion on the basis of the block distortion removal method according to the present invention.

Next, the operation of the MPEG-2 video decoder 101 will be described with respect to the case where inter-frame coded data are decoded.

Initially, an MPEG-2 video code sequence is inputted to the variable-length decoder 102. The variable-length decoder 102 decodes the variable-length code of the inputted code sequence, and extracts parameters such as quantized DCT coefficients, a motion vector used for coding, a quantization scale, and the like. The quantized DCT coefficients obtained in the variable-length decoder 102 are inputted to the inverse quantizer 103 in the order of macroblocks. The inverse quantizer 103 performs inverse quantization on the quantized DCT coefficients, for each of blocks included in each macroblock, using the quantization scale and the quantization matrix obtained in the variable-length decoder 102, thereby generating a DCT coefficient block. Then, the DCT coefficient block is inputted to the inverse DCT unit 104. The inverse DCT unit 104 performs inverse DCT on the DCT coefficient block to obtain a pixel block. The pixel block obtained in the inverse DCT unit 104 is inputted to the adder 105.

On the other hand, the motion compensator 106 receives the motion vector outputted from the variable-length decoder 102. In the MPEG-2 scheme, motion compensation is performed in units of macroblocks. The motion compensator 106 also receives a reference image which is obtained by using the motion vector, from the image memory 107. It is assumed that image data of already-decoded frames are stored in the image memory 107. The reference image is outputted to the adder 105. Therefore, the adder 105 receives the pixel block from the inverse DCT unit 104, and the reference image from the motion compensator 106. The adder 105 adds the pixel block and the reference image, and stores the result of addition as image data in the image memory 107. The above-mentioned operation is identical to the operation of a general MPEG-2 video decoder.

Figure 2:
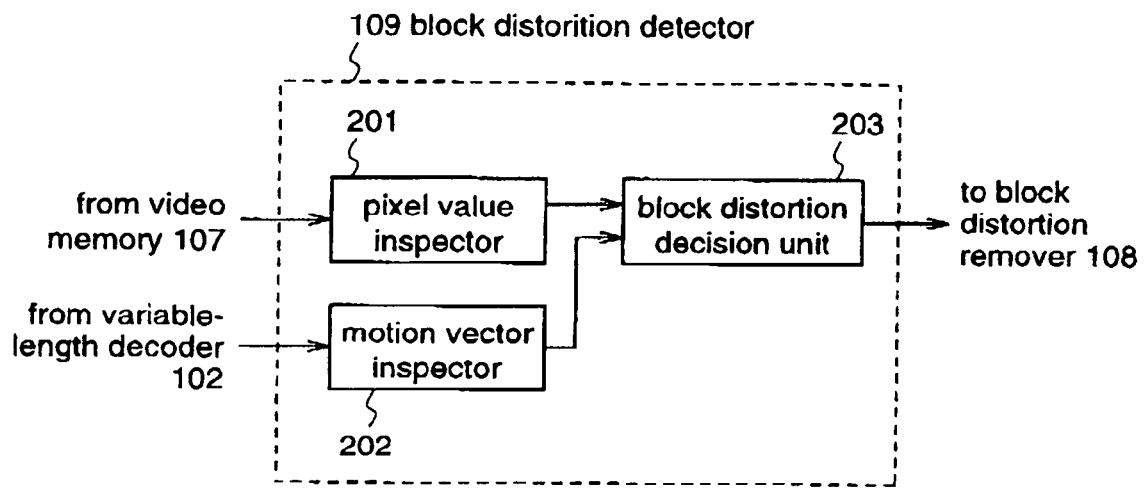
FIG. 2 is a block diagram for explaining a block distortion detector according to the first embodiment.

Next, a description will be given of the operation of the block distortion detector 109 according to the first embodiment. FIG. 2 is a block diagram illustrating the internal structure of the block distortion detector 109. As shown in FIG. 2, the block distortion detector 109 comprises a pixel value inspector 201 for inspecting whether block distortion occurs or not, on the basis of pixel values; a motion vector inspector 202 for inspecting whether block distortion occurs or not, on the basis of the size of a motion vector; and a block distortion decision unit 203 for deciding whether block distortion occurs or not, on the basis of the outputs from these two inspectors. The block distortion detector 109 receives the decoded image data from the image memory 107, and the motion vector from the variable-length decoder 102.

The pixel value inspector 201 receives the image data from the image memory 107. Using the pixel values of pixels in the vicinity of the boundary of adjacent blocks, the pixel value inspector 201 inspects whether block distortion occurs at the block boundary or not. When block distortion occurs, the pixel value inspector 201 determines the strength of the block distortion. A method for detecting block distortion using pixel values is disclosed in, for example, Japanese Published Patent No. 2643636. In this method, it is decided that there occurs block distortion, when the absolute value of a difference between two pixels which are adjacent to each other across the boundary of two blocks is larger than the absolute value of a difference between two pixels which are closest to the block boundary and included in each of the two blocks adjacent to each other. While only the presence or absence of block distortion is detected in this conventional method, not only the presence or absence of block distortion but also the strength thereof are detected in this first embodiment.

Figure 3:
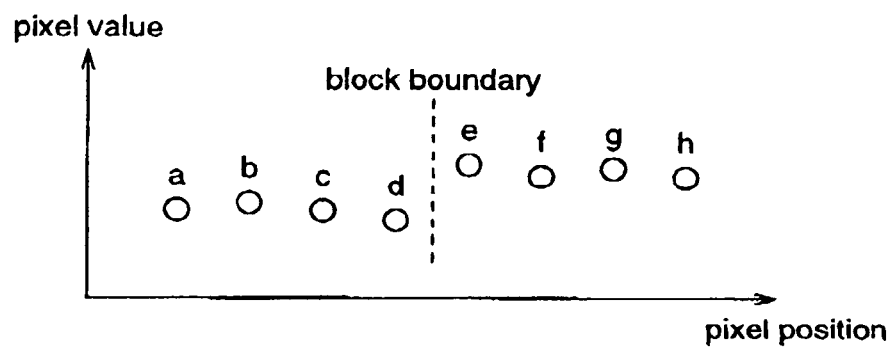
FIGS. 3(a) and 3(b) are schematic diagram for explaining block distortion.
Figure 3:
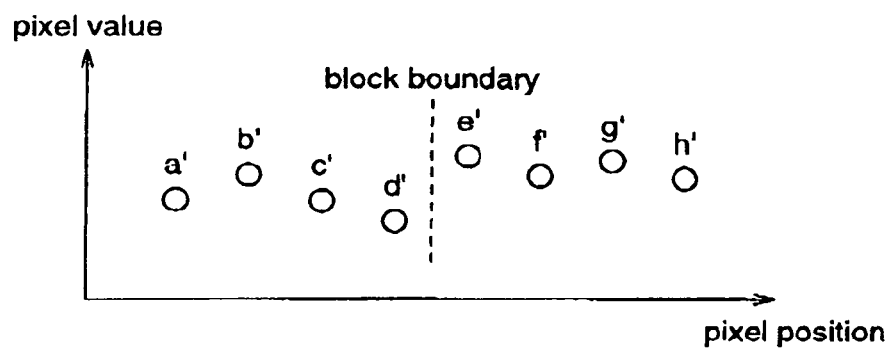

The operation of the pixel value inspector 201 will be described with reference to FIGS. 3(a) and 3(b). In FIGS. 3(a) and 3(b), the abscissa shows pixel positions, and the ordinate shows pixel values. A dotted line between pixels d and e shows the boundary of two blocks (block boundary).

With reference to FIG. 3(a), it is assumed that block distortion occurs between pixels d and e when the following two conditions are satisfied.

Condition 1: The absolute value of a difference in pixel values between pixel d and pixel e should be larger than a first predetermined value (threshold value) TH1.

Condition 2: The absolute values of differences in pixel values between pixel b and pixel c, pixel c and pixel d, pixel e and pixel f, pixel f and pixel g should be smaller than a second predetermined value (threshold value) TH2.

The threshold value TH1 is the lower limit of the absolute value of a difference between two pixels which are adjacent to each other across a block boundary, and the threshold value TH2 is the upper limit of the absolute value of a difference between two pixels which are adjacent to each other in the same block. Therefore, it can be decided with reliability that block distortion occurs, when these threshold values TH1 and TH2 satisfies the relationship of TH1>TH2. However, there is a case where the presence or absence of block distortion can be reliably decided by only the above-mentioned conditions 1 and 2, depending on the values of pixels b, c, d, e, f, and g, even when the relationship of TH1>TH2 does not hold. It is assumed that FIG. 3(a) satisfies the conditions 1 and 2.

Further, although FIG. 3(b) does not satisfy the conditions 1 and 2, it is assumed that FIG. 3(b) satisfies the conditions 1 and 2 when the threshold values TH1 and TH2 are changed to first and second threshold values TH1' and TH2' which are larger than the TH1 and TH2, respectively. In this case, it is decided that block distortion occurs between pixel d' and pixel e' shown in FIG. 3(b).

Further, in this case, it is decided that weak block distortion occurs in FIG. 3(b) while strong block distortion occurs in FIG. 3(a). The reason is as follows. Since the difference in pixel values between adjacent pixels within the same block is large in the case of FIG. 3(b), block distortion is inconspicuous even if it occurs. When such weak block distortion occurs, the absolute value of the difference in pixel values between adjacent pixels within the block becomes large, and the threshold values TH1 and TH2 must be changed to larger values TH1' and TH2' to detect the weak block distortion.

It is desirable that these threshold values TH1' and TH2' also satisfy the relationship of TH1'>TH2'.

The pixel value inspector 201 outputs the result of detection to the block distortion decision unit 203.

Figure 4:
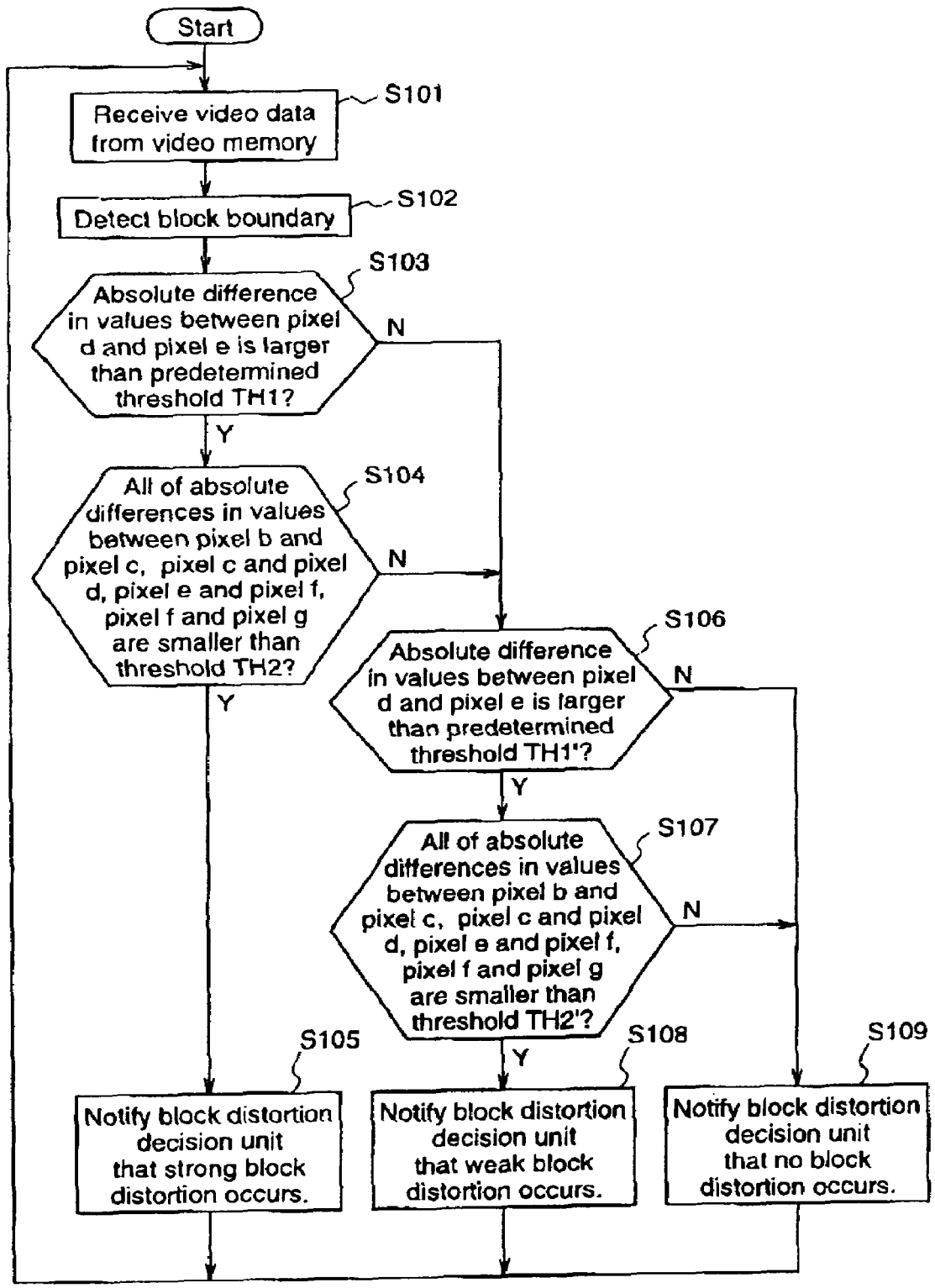
FIG. 4 is a flowchart for explaining the operation of a pixel value inspector according to the first embodiment.

FIG. 4 is a flowchart illustrating the operation of the pixel value inspector 201 described above. In step S101, the pixel value inspector 201 receives, from the image memory 107, image data to be subjected to decision as to whether block distortion occurs or not. In step S102, the pixel value inspector 201 detects the block boundary. This block boundary can be easily detected by counting the pixels eight by eight. Next, in step S103, it is checked whether the above-mentioned condition 1 is satisfied or not, i.e., whether the absolute value of a difference in pixel values between pixel d and pixel e is larger than the threshold value TH1 or not. When the absolute value is larger than the value TH1, it is checked in step S104 whether the condition 2 is satisfied or not, i.e., whether the absolute values of differences in pixel values between pixel b and pixel c, pixel c and pixel d, pixel e and pixel f, pixel f and pixel g are smaller than the threshold value TH2 or not. When these absolute values are smaller than the value TH2, the pixel value inspector 201 notifies the block distortion decision unit 203 that strong block distortion occurs, in step S105. When the result of decision is negative in step S103 or S104, it is checked in step S106 whether the absolute value of the difference between pixel d and pixel e is larger than the threshold value TH1' which is larger than the threshold value TH 1. When the absolute value is larger than the TH1', it is checked in step S107 whether the absolute values of differences in pixel values between pixel b and pixel c, pixel c and pixel d, pixel e and pixel f, pixel f and pixel g are smaller than the threshold value TH2' which is larger than the threshold value TH2. When these absolute values are smaller than the TH2', the pixel value inspector 201 notifies the block distortion decision unit 203 that weak block distortion occurs, in step S108. When the result of decision in step S106 or S107 is negative, the pixel value inspector 201 notifies the block distortion decision unit 203 that no block distortion occurs, in step S109.

The motion vector inspector 202 receives the motion vector from the variable-length decoder 102. The motion vector inspector 202 detects the presence or absence of block distortion and its strength, on the basis of the size of the motion vector. To be specific, assuming that third predetermined values (threshold values) are TH3 and TH4 (TH3>TH4), when the size of the motion vector is larger than the threshold value TH3, it is decided that strong block distortion occurs. When the size of the motion vector is larger than the threshold value TH4 and smaller than the threshold value TH3, it is decided that weak block distortion occurs. When the size of the motion vector is smaller than the threshold value TH4, it is decided that no block distortion occurs. With respect to the motion vector used for the above-mentioned decision, when detecting block distortion at the boundary of two macroblocks, the decision should be made according to whether the maximum value of one of motion vectors of the two macroblocks which are adjacent to each other across the macroblock boundary satisfies the above-mentioned condition or not. The motion vector inspector 202 outputs the result of decision to the block distortion decision unit 203.

Figure 5:
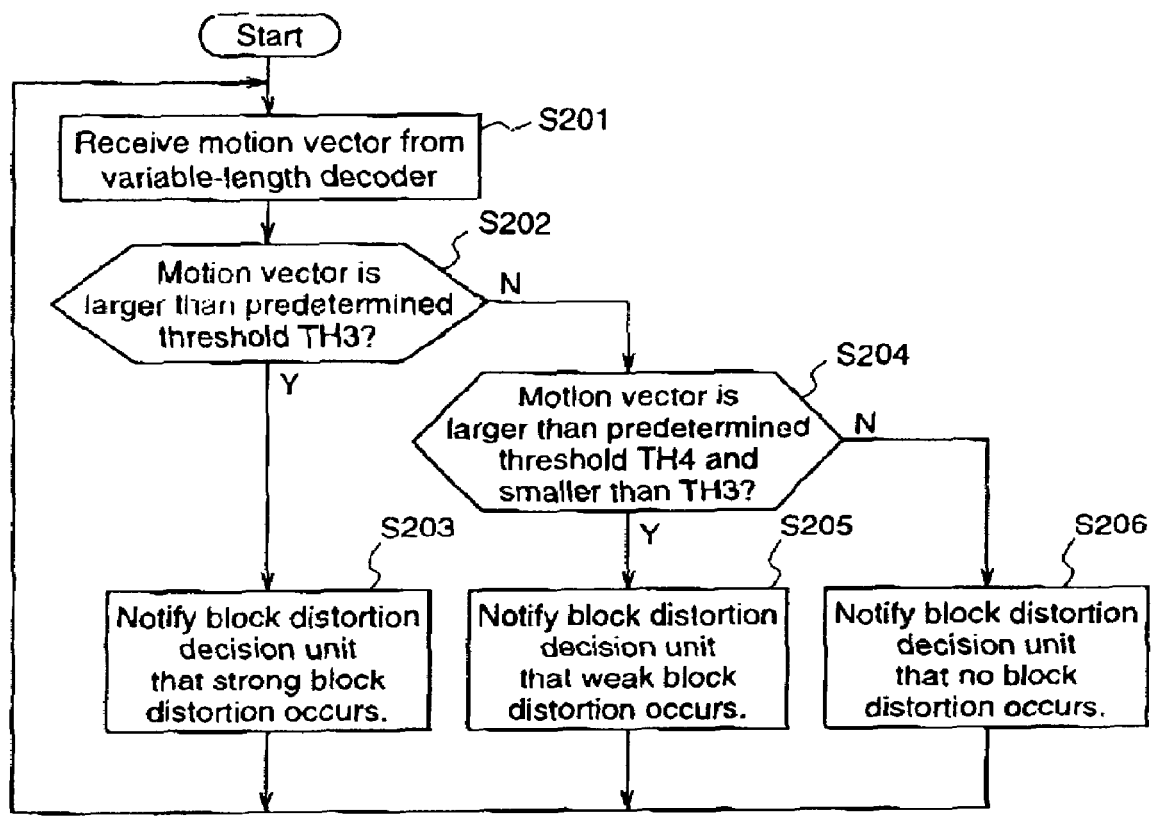
FIG. 5 is a flowchart for explaining the operation of a motion vector inspector according to the first embodiment.

FIG. 5 is a flowchart illustrating the operation of the motion vector inspector 202 described above. In step S201, the motion vector inspector 202 receives the motion vector from the variable-length decoder 102. Next, in step S202, it is checked whether the motion vector is larger than the threshold value TH3 or not. When the motion vector is larger than the TH3, the motion vector inspector 202 notifies the block distortion decision unit 203 that strong block distortion occurs. On the other hand, when the result of decision in step S202 is negative, it is checked in step S204 whether or not the motion vector is larger than the threshold value TH4 and smaller than the threshold value TH3. When the motion vector satisfies this condition, the motion vector inspector 202 notifies the block distortion decision unit 203 that weak block distortion occurs. When the result of decision in step S204 is negative, the motion vector inspector 202 notifies the block distortion decision unit 203 that no block distortion occurs.

The block distortion decision unit 203 receives, as inputs, the result of detection of block distortion based on the pixel values, from the pixel value inspector 201, and the result of detection of block distortion based on the size of the motion vector, from the motion vector inspector 202. The block distortion decision unit 203 decides whether block distortion occurs or not and the strength thereof on the basis of these results of detection. An example of a decision method is shown in Table 1. In Table 1, when the result of detection by the pixel value inspector 201 is "weak block distortion" while the result of detection by the motion vector inspector 202 is "strong block distortion", it is decided that "strong block distortion" occurs. The block distortion decision unit 203 executes table search on Table 1 to perform final decision about block distortion.

In Table 1, the decision by the pixel value inspector 201 takes priority over the decision by the motion vector inspector 202. The reason is as follows. Since the motion vector is generated outside the block distortion decision unit 203 (i.e., in the stage of coding), a motion vector that is not suited for decision of block distortion might be transmitted, depending on the coding scheme. Therefore, in order to increase the reliability of decision, prime importance is placed on the decision by the pixel value inspector 201, which is carried out inside the block distortion decision unit 203. By increasing the reliability of decision as mentioned above, appropriate image correction can be carried out when removing block distortion, thereby suppressing degradation in image quality which is caused by inappropriate correction.

TABLE 1

| decision by pixel value inspector 201 | decision by motion vector inspector 202 | | |
| --- | --- | --- | --- |
| | none | weak | strong |
| none | none | none | none |
| weak | weak | weak | strong |
| strong | weak | strong | strong |

The decision by the block distortion decision unit 203 is outputted to the block distortion remover 108. The block distortion remover 108 receives, as inputs, the image data from the image memory 107 and the result of detection of block distortion from the block distortion detector 109. The block distortion remover 108 subjects the pixels supplied from the image memory 107 to a low-pass filter to remove block distortion, on the basis of the result of detection by the block distortion detector 109. An example of this operation will be described hereinafter with reference to FIGS. 6(a)-6(d).

Figure 6:
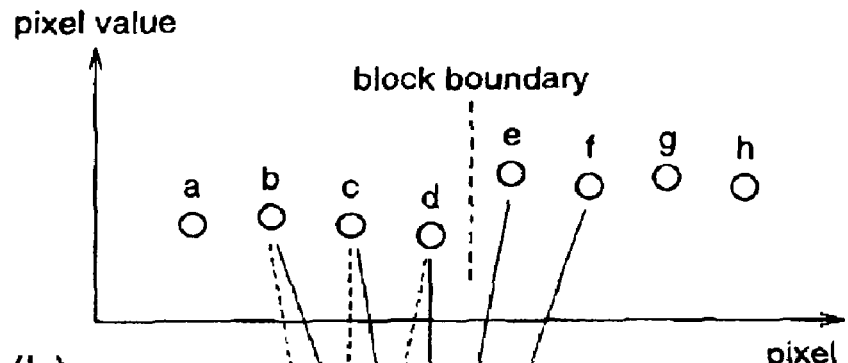
FIGS. 6(a)-6(d) are schematic diagrams for explaining the operation for removing block distortion according to the first embodiment.
Figure 6:
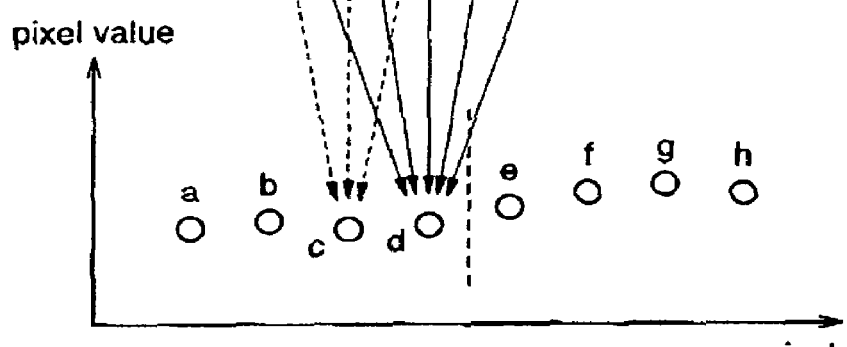
Figure 6:
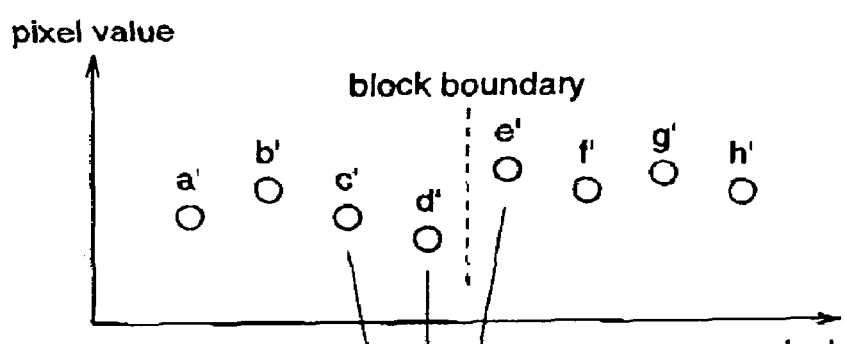
Figure 6:
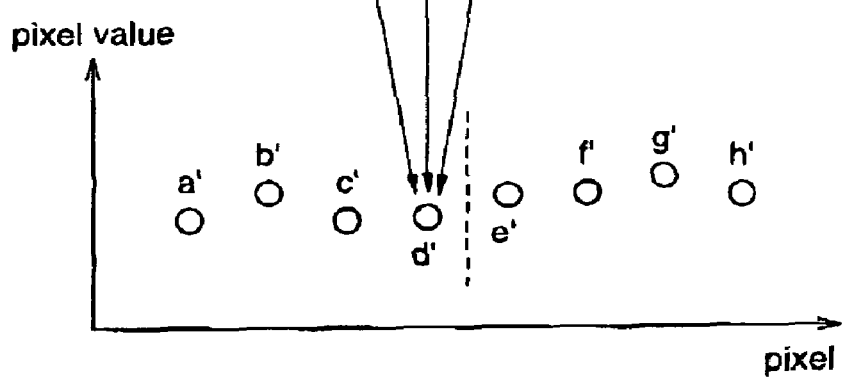
Figure 7:
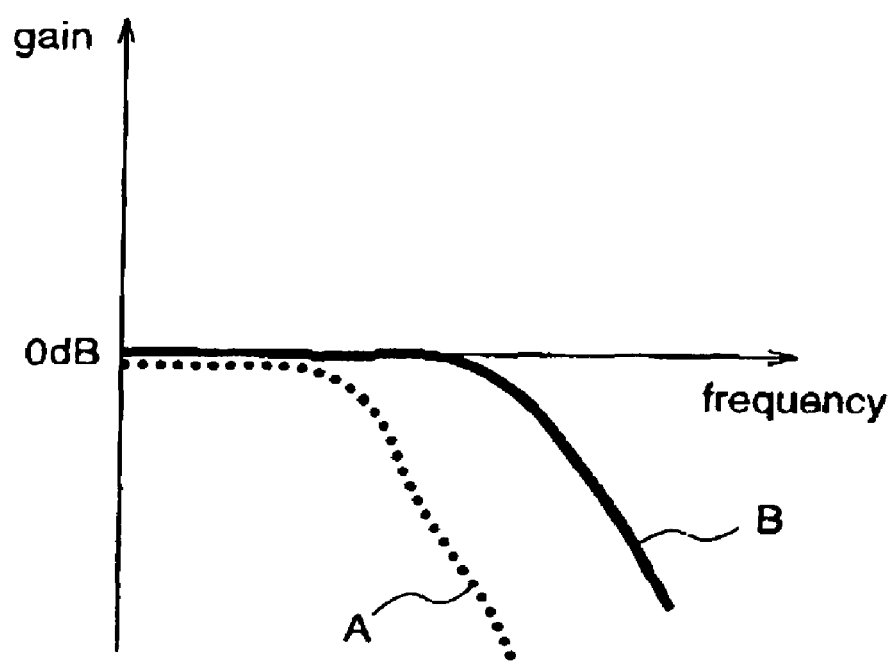
FIG. 7 is a diagram illustrating the characteristics of a low-pass filter.

FIG. 6(a) is a schematic diagram illustrating the same pixels as those shown in FIG. 3(a). It is now assumed that the block distortion detector 109 detects that strong block distortion occurs at the block boundary shown in FIG. 6(a). In this case, two pixels in the vicinity of the block boundary are subjected to filtering. That is, in FIG. 6(a), pixels c, d, e, and f are subjected to filtering. The filter strength may be selected such that it acts strongly on pixels d and e while it acts weakly on pixels c and f. When a low-pass filter is employed, as shown in FIG. 7, the higher the filter strength is, the lower the cutoff frequency is, and the larger the attenuation is. This can be realized by increasing the number of taps. In FIG. 7, profile A shows a filter having a high strength, which is to be applied to pixels in which strong block noise occurs. For example, a 5-tap filter is employed as this filter. Further, profile B shows a filter having a low strength, which is to be applied to pixels in which weak block noise occurs. For example, a 3-tap filter is employed as this filter.

FIGS. 8(a)-8(c) are block diagrams illustrating examples of low-pass filters to be included in the block distortion remover 108. To be specific, FIG. 8(a) shows a 3-tap filter, FIG. 8(b) shows a 5-tap filter, and FIG. 8(c) shows a filter which can change the number of taps by using switches.

In FIGS. 8(a)-8(c), 1081, 1082, 1083, and 1084 denote delay units for delaying input signals by a predetermined period of time; 1085, 1086, 1087, 1088, and 1089 denote multipliers for multiplying the respective input signals by predetermined filter coefficients $\alpha 1$, $\alpha 2$, $\alpha 1$, $\alpha 3$, $\alpha 4$, and $\alpha 5$, respectively; 1101 denotes an adder for adding the outputs from the multipliers 1085, 1086, and 1087; 1102 denotes an adder for adding the outputs from the multipliers 1085, 1086, 1087, 1088, and 1089; and 1090, 1091, and 1092 denote switches.

When the block distortion detector 109 detects that strong block distortion occurs, the switches 1090 and 1091 are turned on to make the circuit shown in FIG. 8(c) perform as a 5-tap low-pass filter. When the block distortion detector 109 detects that weak block distortion occurs, the switches 1090 and 1091 are turned off to make the circuit shown in FIG. 8(c) perform as a 3-tap low-pass filter. Further, the switch 1092 is turned on with respect to pixels other than those in the vicinity of the block boundary or pixels in the case where no block distortion is detected, and bypasses the circuit of FIG. 8(c) so that the image data from the image memory 107 are not subjected to the low-pass filter.

FIG. 6(a) shows the case where the pixel d is subjected to the 5-tap low-pass filter while the pixel c is subjected to the 3-tap low-pass filter. As the result of the filtering, pixel values as shown in FIG. 6(b) are obtained.

FIG. 6(c) is a schematic diagram illustrating the same pixels as those shown in FIG. 3(b). It is now assumed that the block distortion detector 109 decides that weak block distortion occurs at the block boundary shown in FIG. 6(c). In this case, one pixel in the vicinity of the block boundary is subjected to filtering. That is, in FIG. 6(c), pixels d' and e' are subjected to filtering. FIG. 6(c) shows the case where the pixel d' is subjected to the 3-tap low-pass filter. As the result of the filtering, pixel values shown in FIG. 6(d) are obtained. The image data processed by the block distortion remover 108 are outputted as an output image.

As described above, in the block distortion detection method and the bock distortion detection apparatus according to the first embodiment, initially, a difference in pixel values between pixels across the boundary of two blocks and a difference in pixel values between pixels in each of the two blocks are compared with predetermined threshold values, respectively, and the presence or absence of block distortion and the strength thereof are detected from the result of the comparison. Next, the presence or absence of block distortion and the strength thereof are detected on the basis of the size of the motion vector. Thereafter, the presence or absence of block distortion and the strength thereof are finally decided on the basis of the result of the block distortion detection based on the pixel values in combination with the result of the block distortion detection based on the size of the motion vector.

Further, in the block distortion removal method and the block distortion removal apparatus according to the first embodiment, after block distortion and its strength are detected, the image data are subjected to filtering according to the strength of the block distortion to remove the block distortion.

In the block distortion detection method and the block distortion detection apparatus according to the first embodiment, the presence or absence of block distortion and the strength thereof are finally decided on the basis of the result of the block distortion detection based on the pixel values in combination with the result of the block distortion detection based on the size of the motion vector. Therefore, it is possible to detect block distortion which cannot be detected by the conventional method or apparatus using only the pixel values or the motion vector. Conversely, false detection of block distortion according to the result of detection by only the pixel values or the motion vector is avoided. Further, since noise removal according to the strength of block distortion can be carried out by using the block distortion removal method and the block distortion removal apparatus according to the first embodiment, block distortion can be removed reliably without performing false detection while minimizing the blurriness of the image.

While in this first embodiment MPEG-2 is employed as a coding scheme, any coding scheme, such as MPEG-1, MPEG-4, H.261, H.263 or the like, may be employed as long as it employs motion compensation. However, the size of block and the size of motion compensation unit vary among the coding methods.

While in this first embodiment the pixel value inspector 201 or the motion vector inspector 202 detects the strength of block distortion in two levels, i.e., "weak" and "strong", the strength of block distortion may be classified into a predetermined number of levels equal to or larger than 3 levels.

While in this first embodiment the pixel value inspector 201 detects the presence or absence of block noise and the strength thereof by using pixels b~g, the inspector 201 may use more pixels for the detection, or it may use less pixels for the detection.

In this first embodiment, the motion vector inspector 202 decides that block distortion occurs, when one of the motion vectors of adjacent two macroblocks is larger than the predetermined threshold value. However, the inspector 202 may decide that block distortion occurs, when both of these motion vectors are larger than the predetermined threshold value.

While in this first embodiment the block distortion decision unit 203 makes final decision as to whether block distortion occurs or not by using Table 1, the final decision about block distortion is not necessarily based on the combinations on Table 1.

Further, while in this first embodiment the filter used by the block distortion remover 108 is a low-pass filter, any filter may be used so long as it can remove block distortion. For example, a median filter, a non-linear filter, or the like may be used.

In this first embodiment, four pixels in the vicinity of the block boundary are subjected to filtering when the type of the filter is a medium-strength filter, and six pixels in the vicinity of the block boundary are subjected to filtering when the type of the filter is a high-strength filter. However, the range of pixels to be filtered may be different from that described for the first embodiment.

Further, while in this first embodiment block distortion at the boundary of blocks which are adjacent to each other in the horizontal direction is detected and removed, the same processing as mentioned above may be performed to detect and remove block distortion at the boundary of blocks which are adjacent to each other in the vertical direction.

Further, this first embodiment is described with respect to a method and an apparatus for detecting block distortion using pixel values by the pixel value inspector 201 and detecting block distortion using a motion vector by the motion vector inspector 202 in the case where the target image has been subjected to inter-frame coding. However, block distortion may be detected by using the pixel value inspector 201 alone. Especially when the target image has been subjected to intra-frame coding and therefore there is no motion vector information, block distortion should be detected by using the pixel value inspector 201 alone.

Embodiment 2

A second embodiment of the present invention corresponds to claims 12 and 24.

The second embodiment of the present invention is different from the first embodiment in the operation of the block distortion remover 108. Accordingly, only the operation of the block distortion remover 108 according to the second embodiment will be described hereinafter.

Figure 9:
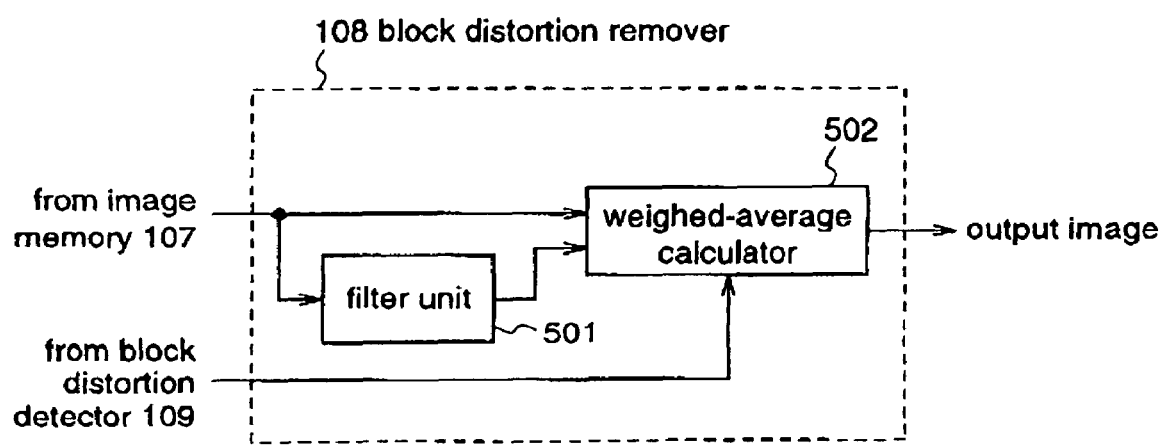
FIG. 9 is a block diagram illustrating a block distortion remover according to a second embodiment of the present invention.

FIG. 9 is a block diagram illustrating the construction of the block distortion remover 108 according to the second embodiment. The block distortion remover 108 comprises a filter unit 501 and a weighted-average calculator 502.

The block distortion remover 108 receives image data from the image memory 107, and the result of detection of block distortion from the block distortion detector 109. The image data supplied from the image memory 107 is inputted to the filter unit 501 and the weighted-average calculator 502. In the filter unit 501, pixels in the vicinity of all block boundaries are subjected to filtering. For example, the pixels adjacent to each block boundary are subjected to a 5-tap low-pass filter, and the pixels adjacent to these pixels are subjected to a 3-tap low-pass filter. The output from the filter unit 501 is inputted to the weighted-average calculator 502. The weighted-average calculator 502 receives the image data from the image memory 107, the image data from the filter unit 501, which is obtained by filtering the pixels at the block boundary, and the result of detection of block distortion from the block distortion detector 109. The weighted-average calculator 502 performs weighted-averaging of the image data supplied from the image memory 107 and the image data supplied from the filter unit 501, according to the block distortion detection result. The manner of weighted-averaging will be described with reference to FIGS. 10(a)-10(c).

Figure 10:
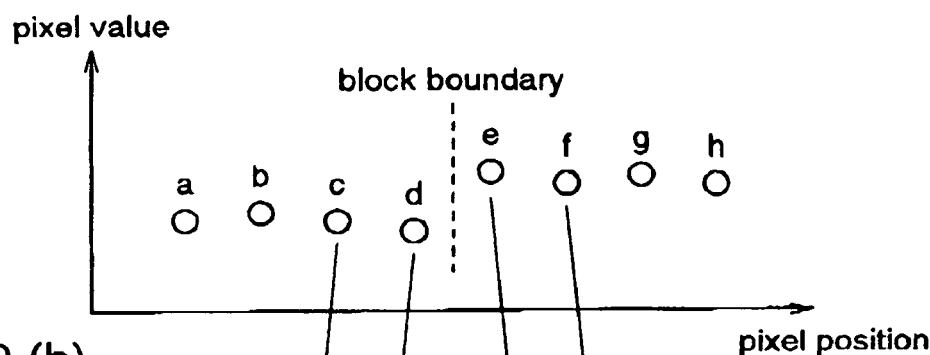
FIGS. 10(a)-10(c) are schematic diagrams for explaining the operation for removing block distortion according to the second embodiment.
Figure 10:
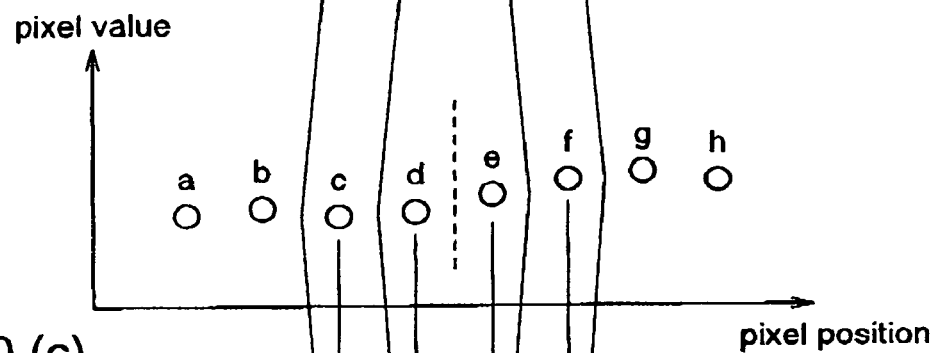
Figure 10:
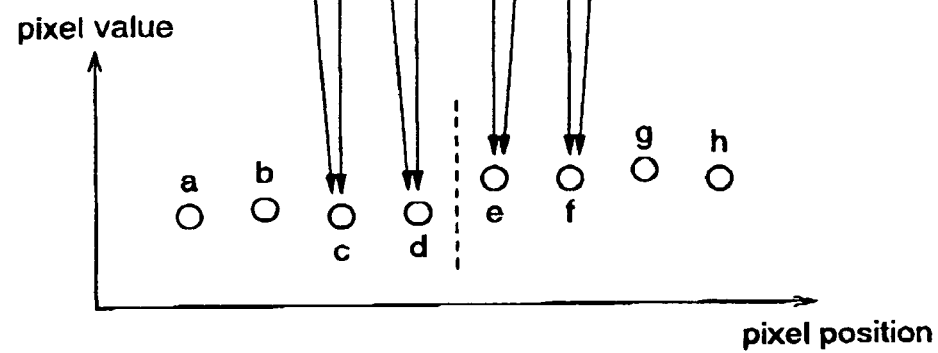

FIGS. 10(a)-10(c) are schematic diagrams illustrating pixels in the vicinity of the boundary of two blocks, and the values of these pixels, wherein the abscissa shows the pixel positions while the ordinate shows the pixel values. FIG. 10(a) shows the image data supplied from the image memory 107, and FIG. 10(b) shows the image data supplied from the filter unit 501. That is, pixels c~f shown in FIG. 10(b) are generated by subjecting the pixels shown in FIG. 10(a) to a low-pass filter.

It is now assumed that the strength of block distortion is classified into levels of "none", "weak", and "strong", and the block distortion detector 109 detects one of these levels as the strength of block distortion. When the block distortion detector 109 detects that block distortion at the block boundary is "none", the weighted-average calculator 502 outputs the image data shown in FIG. 10(a) (i.e., the image data supplied from the image memory 107) as it is. When it is detected that block distortion at the block boundary is "weak", the weighted-average calculator 502 calculates the average of the image data shown in FIG. 10(a) and the image data shown in FIG. 10(b) with respect to pixels c-f, and outputs the average. That is, the calculator 502 performs weighted-averaging of the image data supplied from the image memory 107 and the image data supplied from the filter unit 501, and outputs the weighted average. In this case, the image data become as shown in FIG. 10(c). Further, when it is detected that block distortion at the block boundary is "strong", the weighted-average calculator 502 outputs the image data shown in FIG. 10(b) (i.e., the image data supplied from the filter unit 501) as it is.

As described above, in the block distortion removal method and the block distortion removal apparatus according to the second embodiment, the presence or absence of block distortion and the strength thereof, which have been detected, are inputted, and pixels in the vicinity of all block boundaries in the inputted image are subjected to filtering, and the input image and the filtered image are subjected to weighted-averaging according to the strength of the block distortion.

By using the block distortion removal method or apparatus according to the second embodiment, removal of detected block distortion according to the strength of the block distortion can be carried out using a single filter, without the necessity of changing the combination of filters according to the strength of the block distortion. Thereby, the hardware scale or the like can be reduced. Further, although a single filter is used, since the weights of the input image and the filtered image are changed according to the strength of the block distortion, noise removal according to the strength of the block distortion can be carried out, whereby the block distortion can be reliably removed without performing false detection while minimizing the blurriness of the image.

While in this second embodiment the strength of block distortion is detected in two levels, "weak" and "strong", the strength of block distortion may be detected in three or more levels. In this case, the weight on the image data supplied from the filter unit 501 should be increased as the strength of block distortion becomes higher.

While in this second embodiment four pixels in the vicinity of the block boundary are subjected to filtering in the filter unit 501, the range of pixels to be filtered may be different from that described for the second embodiment.

Further, while in this second embodiment block distortion at the boundary of blocks which are adjacent to each other in the horizontal direction is detected and removed, the same processing as mentioned above may be performed with respect to the boundary of blocks which are adjacent to each other in the vertical direction.

Embodiment 3

A third embodiment of the present invention corresponds to claims 5~11 and 17~23.

Figure 11:
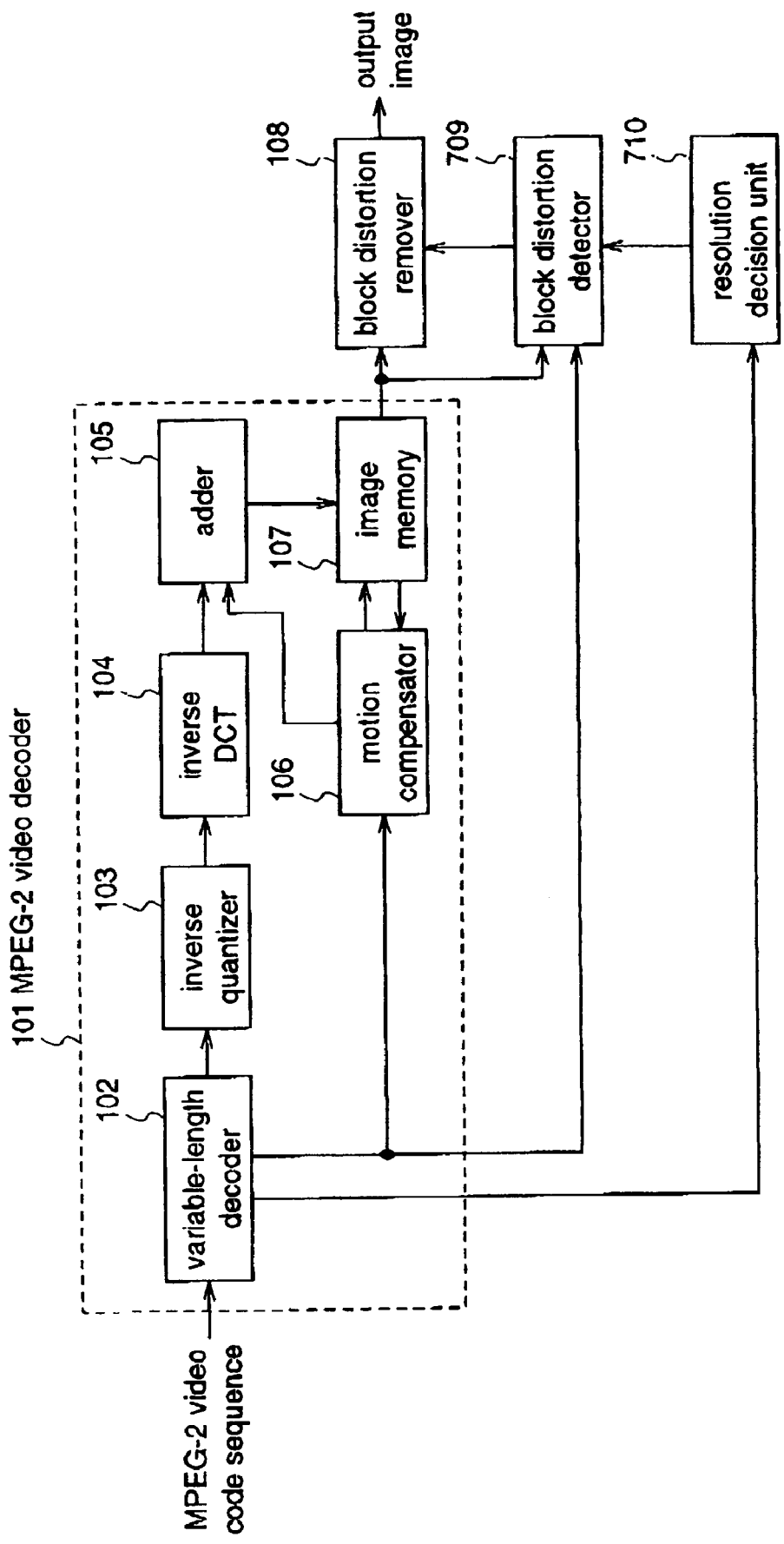
FIG. 11 is a block diagram for explaining a third embodiment of the present invention.

FIG. 11 is a block diagram illustrating an MPEG-2 decoder having a block distortion detection apparatus and a block distortion removal apparatus for performing a block distortion detection method and a block distortion removal method according to the third embodiment, respectively. In FIG. 11, a variable-length decoder 102, an inverse quantizer 103, an inverse DCT unit 104, an adder 105, a motion compensator 106, and an image memory 107 are identical to those shown in FIG. 1.

The MPEG-2 decoder according to the third embodiment further includes a block distortion remover 108, a block distortion detector 709, and a resolution decision unit 710. The resolution decision unit 710 decides a range where the resolution of an MPEG-2 code sequence belongs, by referring to resolution data included in the decoding result of the MPEG-2 code sequence.

The operations of the variable-length decoder 102, the inverse quantizer 103, the inverse DCT unit 104, the adder 105, and the image memory 107 are identical to those already described for the first embodiment and, therefore, repeated description is not necessary. However, this third embodiment is different from the first embodiment in that the variable-length decoder 102 has a function of outputting information about the resolution (i.e., the number of pixels) which is obtained from the inputted code sequence, to the resolution decision unit 710.

The resolution decision unit 710 receives the image resolution, i.e., the number of horizontal pixels and the number of vertical pixels on the screen, from the variable-length decoder 102. The resolution decision unit 710 decides whether the resolution is higher than a predetermined resolution or not. Then, the resolution decision unit 710 outputs the decision to the block distortion detector 709.

Figure 12:
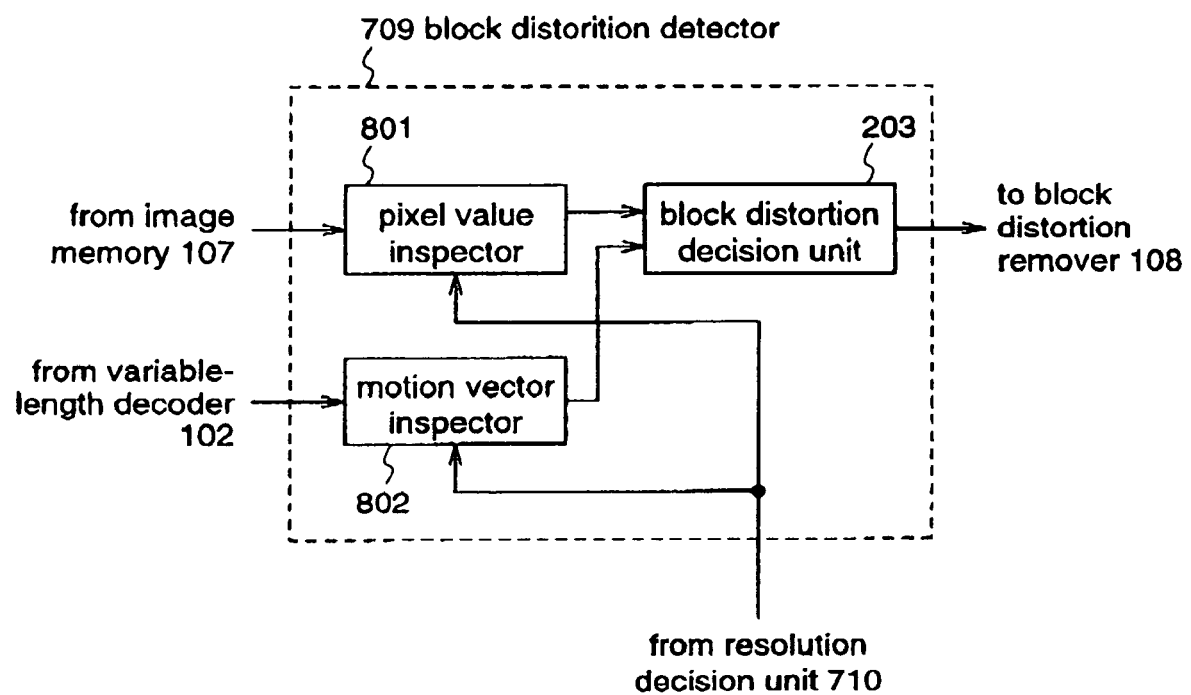
FIG. 12 is a block diagram illustrating a block distortion detector according to the third embodiment.

Next, the operation of the block distortion detector 709 will be described. FIG. 12 is a block diagram illustrating the internal structure of the block distortion detector 709. As shown in FIG. 12, the block distortion detector 709 comprises a pixel value inspector 801, a motion vector inspector 802, and a block distortion decision unit 203. The block distortion detector 709 receives the decoded image data from the image memory 107, the motion vector from the variable-length decoder 102, and the result of decision about the resolution from the resolution decision unit 710.

The pixel value inspector 801 receives the decoded image data from the image memory 107, and the result of decision about the resolution from the resolution decision unit 710. When the resolution decision unit 710 decides that the resolution is low, the pixel value inspector 801 performs the same operation as that of the pixel value inspector 201 according to the first embodiment. That is, in FIG. 3(a), when the absolute value of a difference in pixel values between pixel d and pixel e is larger than the threshold value TH1 and the absolute values of differences in pixel values between pixel b and pixel c, pixel c and pixel d, pixel e and pixel f, pixel f and pixel g are smaller than the threshold value TH2, the pixel value inspector 801 judges that block distortion occurs between pixel d and pixel e.

When the resolution is high, the pixel value inspector 801 performs detection of block distortion, with less volume of processing than the operation of the pixel value inspector 201 according to the first embodiment. In order to reduce the volume of processing, there is a method of reducing the number of pixels to be used for detection of block distortion, or a method of reducing the number of levels of strength of block distortion to be detected. In the case of reducing the number of pixels to be used for detection of block distortion, for example, detection may be carried out using pixels C~f while pixels b~g are used in the first embodiment (refer to FIG. 3(a)). In the case of reducing the number of levels of strength of block distortion to be detected, for example, block distortion may be classified into two levels, "presence" and "absence", while, in the first embodiment, block distortion is classified into three levels "none", "weak", and "strong" by comparing the pixel values with the threshold values TH1 and TH2 and with the threshold values TH1' and TH2' which are larger than the TH1 and TH2. The pixel value inspector 201 outputs the result of decision to the block distortion decision unit 203.

The motion vector inspector 802 receives the motion vector from the variable-length decoder 102, and the result of decision about the resolution from the resolution decision unit 710. The motion vector inspector 802 performs the same operation as that of the motion vector inspector 202 according to the first embodiment when the resolution decided by the resolution decision unit 710 is low. That is, the motion vector inspector 802 detects whether block distortion occurs or not and its strength, on the basis of the size of the motion vector. For example, the motion vector inspector 802 judges that strong block distortion occurs when the size of the motion vector is larger than the threshold value TH3, that weak block distortion occurs when the size of the motion vector is larger than the threshold value TH4 and smaller than the threshold value TH3, and that no block distortion occurs when the size of the motion vector is smaller than the threshold value TH4.

When the resolution is high, the motion vector inspector 802 performs inspection on the motion vector, with less volume of processing than the operation of the motion vector inspector 202 according to the first embodiment. In order to reduce the volume of processing, there is a method of reducing the number of levels of block distortion to be detected by the motion vector, or a method of performing no detection of block distortion using the motion vector.

The block distortion decision unit 203 receives the result of detection of block distortion on the basis of the pixel values, which is supplied from the pixel value inspector 801, and the result of detection of block distortion on the basis of the size of the motion vector, which is supplied from the motion vector inspector 802. The block distortion decision unit 203 finally decides the presence or absence of block distortion and its strength, from these results of detection. Since this operation is identical to that already described for the first embodiment, repeated description is not necessary. The decision by the block distortion decision unit 203 is outputted to the block distortion remover 108.

The block distortion remover 108 receives, as inputs, the image data from the image memory 107, and the result of detection of block distortion from the block distortion detector 709. The block distortion remover 108 removes the block distortion on the basis of the result of detection by the block distortion detector 709. Since this operation is identical to that already described for the first or second embodiment, repeated description is not necessary.

As described above, in the block distortion detection method or apparatus according to the third embodiment, initially, a difference in pixel values between pixels across the boundary of two blocks and a difference in pixel values between pixels in each of the two blocks are compared with predetermined threshold values, and the presence or absence of block distortion and its strength are detected from the result of comparison. Next, on the basis of the size of the motion vector, the presence or absence of block distortion and its strength are detected. At this time, the processing method is changed according to the resolution of the input image, and detection of block distortion is carried out with less volume of processing as the resolution is higher. Thereafter, the presence or absence of block distortion and its strength are finally detected on the basis of the result of detection of block distortion based on the pixel values in combination with the result of detection of block distortion based on the size of the motion vector.

Using the block distortion method or apparatus according to the third embodiment, the presence or absence of block distortion and its strength are finally decided on the basis of the result of detection based on the pixel values in combination with the result of detection based on the size of the motion vector. Therefore, it is possible to detect occurrence of block distortion which cannot be detected by the conventional method or apparatus using only the pixel values or the motion vector. Conversely, false detection of block distortion by using only the pixel values or the motion vector can be avoided.

Furthermore, in the block distortion removal method or apparatus according to the third embodiment, since noise removal is carried out according to the strength of block distortion, removal of block distortion can be carried out reliably without performing false detection while minimizing the blurriness of the image. Further, detection of block distortion can be carried out with less volume of processing as the resolution of the input image is higher. That is, the lower the resolution is, the smaller the volume of decoding processing becomes, and the larger the volume of processing for removing block distortion becomes. The higher the resolution is, the larger the volume of decoding processing becomes, and the smaller the volume of processing for removing block distortion becomes. Thus, the total volume of processing, i.e., decoding and block noise removal, can be reduced.

While in this third embodiment MPEG-2 is employed as a coding scheme, any coding scheme, such as MPEG-1, MPEG-4, H.261, H.263, or the like, may be employed so long as the coding scheme uses motion compensation. However, the size of block and the size of motion compensation unit vary among the coding methods.

While in this third embodiment the volume of processing is reduced in both of the pixel value inspector 801 and the motion vector inspector 802 when the resolution of the input image is high, the volume of processing may be reduced in either of these inspectors.

Further, while in this third embodiment the volume of processing by the pixel value inspector 801 or the motion vector inspector 802 is changed in two levels of the resolution of the input image, i.e., "high resolution" and "low resolution", the number of levels may be larger than "2".

Furthermore, this third embodiment is described with respect to a method and an apparatus for detecting block distortion using pixel values by the pixel value inspector 801 and detecting block distortion using a motion vector by the motion vector inspector 802 in the case where the target image has been subjected to inter-frame coding. However, block distortion may be detected by using the pixel value inspector 801 alone. Especially when the target image has been subjected to intra-frame coding and therefore there is no motion vector information, block distortion should be detected by using the pixel value inspector 801 alone.

Furthermore, while in the first to third embodiments block distortion at the boundary of adjacent blocks is detected and removed, the present invention is also applicable to the case where block distortion at the boundary of blocks/motion compensation units, which is the boundary of adjacent blocks as well as adjacent motion compensation units (i.e., macroblocks), is detected and removed. Also in this case, the same effects as described above are achieved.

What is claimed is:

1. A block distortion detection method comprising:
   receiving a decoded image signal obtained by decoding code sequences which are obtained by dividing an image signal into plural blocks each comprising plural pixels and then coding the image signal, and obtaining a first difference in pixel values between two pixels across the boundary of adjacent blocks, and a second difference in pixel values between two pixels which belong to a block in the vicinity of the block boundary; and
   performing detection of block distortion at the block boundary using the values of the first and second differences, by a detection method in which the volume of processing decreases as the resolution of the decoded image signal becomes larger.

2. A block distortion detection method comprising:
   receiving a decoded image signal obtained by decoding code sequences which are obtained by dividing an image signal into plural blocks each comprising plural pixels and then coding the image signal using motion compensation for a unit including at least one block, and obtaining a first difference in pixel values between two pixels across the boundary of blocks/motion-compensation-units-which is the boundary of adjacent blocks as well as the boundary of adjacent motion compensation units, and a second difference in pixel values between two pixels which belong to a block in the vicinity of the boundary of blocks/motion-compensation-units; and
   performing detection of block distortion at the boundary of blocks/motion-compensation-units, using the values of the first and second differences and the amount of motion in motion compensation units across the boundary of blocks/motion-compensation-units, by a detection method in which the volume of processing decreases as the resolution of the decoded image signal becomes larger.

3. A block distortion detection method as defined in claim 1, wherein the reduction of the volume of processing is carried out by reducing the number of pixels to be used for detection of block distortion.

4. A block distortion detection method as defined in claim 1, wherein the reduction of the volume of processing is carried out by reducing the number of strength levels of block distortion to be detected.

5. A block distortion detection method as defined in claim 2, wherein the reduction of the volume of processing is carried out by executing no detection of block distortion using the amount of motion when the resolution is high.

6. A block distortion detection method as defined in claim 2, wherein the reduction of the volume of processing is carried out by reducing the number of pixels to be used for detection of block distortion.

7. A block distortion detection method as defined in claim 2, wherein the reduction of the volume of processing is carried out by reducing the number of strength levels of block distortion to be detected.

8. A block distortion removal method for removing the block distortion which is detected by the block distortion detection method according to claim 1, wherein the pixel values of pixels in the vicinity of the block boundary are corrected according to the result of the detection of block distortion.

9. A block distortion removal method for removing the block distortion which is detected by the block distortion detection method according to claim 2, wherein the pixel values of pixels in the vicinity of the block boundary are corrected according to the result of the detection of block distortion.

10. A block distortion removal method as defined in claim 8, wherein the correction of pixel values is carried out using a filter having different characteristics according to the strength levels of block distortion.

11. A block distortion removal method as defined in claim 8 wherein, after the pixels in the vicinity of the boundary are subjected to a predetermined filtering, the correction of pixel values is carried out by using pixel values which are obtained by performing weighted-averaging on the pixels of the decoded image and the filtered pixels, according to the strength of the block distortion.

12. A block distortion removal method as defined in claim 9, wherein the correction of pixel values is carried out using a filter having different characteristics according to the strength levels of block distortion.

13. A block distortion removal method as defined in claim 9 wherein, after the pixels in the vicinity of the boundary are subjected to a predetermined filtering, the correction of pixel values is carried out by using pixel values which are obtained by performing weighted-averaging on the pixels of the decoded image and the filtered pixels, according to the strength of the block distortion.

* * * * *